United States Patent
Hwang et al.

(10) Patent No.: US 6,380,073 B1
(45) Date of Patent: Apr. 30, 2002

(54) METHOD FOR FORMING METAL INTERCONNECTION STRUCTURE WITHOUT CORNER FACETED

(75) Inventors: Tsing-Fong Hwang, Tainan; Tsung-Yuan Hung, Hsin-Chu, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 9 days.

(21) Appl. No.: 09/650,910

(22) Filed: Aug. 29, 2000

(51) Int. Cl.[7] .......................................... H01L 21/4763
(52) U.S. Cl. ...................... 438/637; 438/689; 438/700; 438/740; 438/597
(58) Field of Search .................................. 438/597, 622, 438/624, 634, 636, 637, 638, 675, 700, 738, 740, 689

(56) References Cited

U.S. PATENT DOCUMENTS

| | | | |
|---|---|---|---|
| 5,821,169 A | * 10/1998 | Nguyen et al. | 438/736 |
| 5,877,075 A | * 3/1999 | Dai et al. | 438/597 |
| 5,882,996 A | * 3/1999 | Dai | 438/597 |
| 5,895,253 A | * 4/1999 | Akram | 438/424 |
| 6,025,277 A | * 2/2000 | Chen et al. | 438/738 |
| 6,057,239 A | * 5/2000 | Wang et al. | 438/689 |
| 6,100,184 A | * 8/2000 | Zhao et al. | 438/638 |
| 6,136,680 A | * 10/2000 | Lai et al. | 438/597 |
| 6,153,511 A | * 11/2000 | Watatani | 438/623 |
| 6,177,364 B1 | * 1/2001 | Huang | 438/792 |
| 6,204,168 B1 | * 3/2001 | Naik et al. | 438/638 |
| 6,211,061 B1 | * 4/2001 | Chen et al. | 438/622 |
| 6,294,457 B1 | * 9/2001 | Liu | 438/623 |
| 6,297,149 B1 | * 10/2001 | Stamper | 438/637 |

FOREIGN PATENT DOCUMENTS

| | | | | |
|---|---|---|---|---|
| GB | 2340657 A | * | 2/2000 | H01L/21/768 |
| JP | 11154703 A | * | 6/1999 | H01L/21/27 |
| JP | 2000114373 A | * | 4/2000 | H01L/21/768 |

OTHER PUBLICATIONS

Hiroi et al. "Dual Hard Mask Process for low–K Porous Organosilica Dielectric in Copper Dual Damascene Interconnect Fabrication", IEEE 2001, pp. 295–297.*

* cited by examiner

*Primary Examiner*—Matthew Smith
*Assistant Examiner*—Renzo N. Rocchegiani (57) ABSTRACT

A method for forming metal interconnection structure is disclosed. A semiconductor substrate is provided, the substrate has a first silicon nitride layer formed thereon, and a first inter-metal layer formed on the surface of the first stop layer. The first inter-metal layer is etched to form an opening in the inter-metal layer using the first photoresist. A second silicon nitride layer is formed. A dielectric layer is formed. A second inter-metal layer is formed. The second inter-metal layer is etched using the second photoresist. The third silicon nitride layer is formed. The third layer is etched back. The dielectric layer is removed. The third stop layer, the second silicon, nitride layer and the first stop layer are etched. The barrier layer is deposited into a via trench. The trenches are filled by a metal layer. Finally, the metal layer is planarized.

23 Claims, 11 Drawing Sheets

METHOD FOR FORMING METAL INTERCONNECTION STRUCTURE WITHOUT CORNER FACETED

BACKGROUND OF THE INVENTION

1. Field of the Invention

The invention relates to the formation of dual damascene structure, more particularly for forming a metal via structure without corner faceted.

2. Description of the Prior Art

Currently, demand for integrated circuits (I.C.) has rapidly increased due to widespread use of electronic equipment. In particular, the increasing popularity of some electronic equipment such as, for example, many kinds of computers are gradually increasing the demand for the large or very large semiconductor memories. Therefore, the advanced manufacturing technology for improvement fabrication of integrated circuit is in greater demand than before.

Normally, the size and performance of the power IC devices depends critically on a specific point at a particular breakdown voltage of the output devices. Since the thickness of semiconductor is usually limited by technological constraints, higher breakdown voltages typically require more layers. However, since the device on resistance is proportional to the expitaxial layer resistivity, higher breakdown voltages have to generally be traded off for limited drive current capability.

Thus, there is a conventional method described as referring to FIGS. 1A to 1D, which are the method for forming inter-metal dielectric by using dual damascene for precisely controlling the shape and area of the interconnect.

Then, the following description will explain the various steps of one conventional method for forming dual damascene structure by referring to FIGS. 1A to 1E.

Figure 1A:
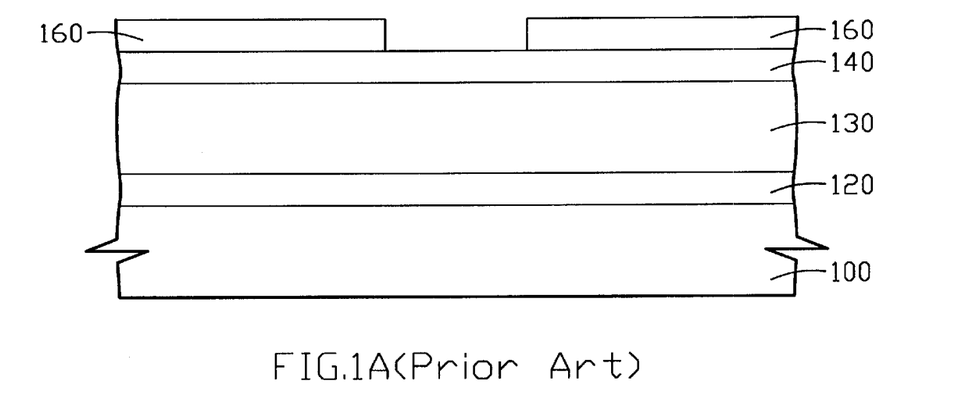
FIGS. 1A through 1E are illustrative of various components in the structure with the prior art.

In the manufacture of a conventional dual damascene structure, there is a substrate 100 having a stop layer 120 formed therein as shown in FIG. 1A. An inter-metal dielectric layer 130 and a stop layer 140 are subsequently deposited on the substrate 100. This stop layer 120, 140 both are silicon nitride as a trench etching stop layer. Then, the photoresist layer 160 having a via pattern is formed on the stop layer 140.

Figure 1B:
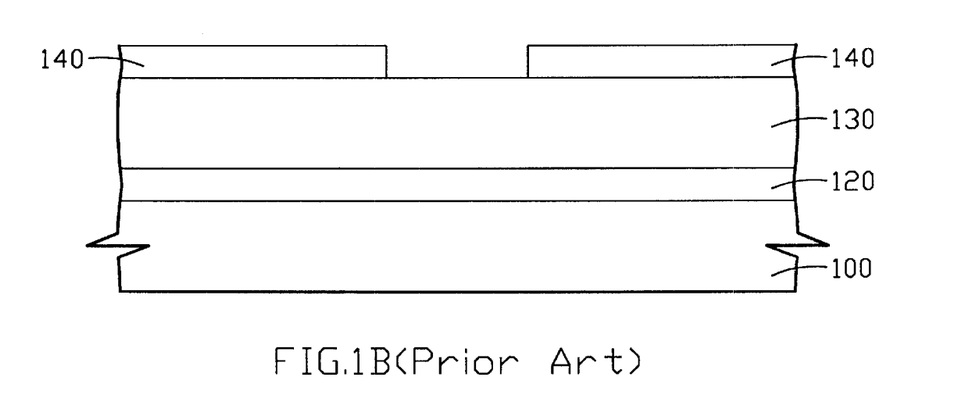

Then, an anisotropic etch is performed to etch through the stop layer 140, and the photoresist layer 160 is removed, as shown in FIG. 1B.

Figure 1C:
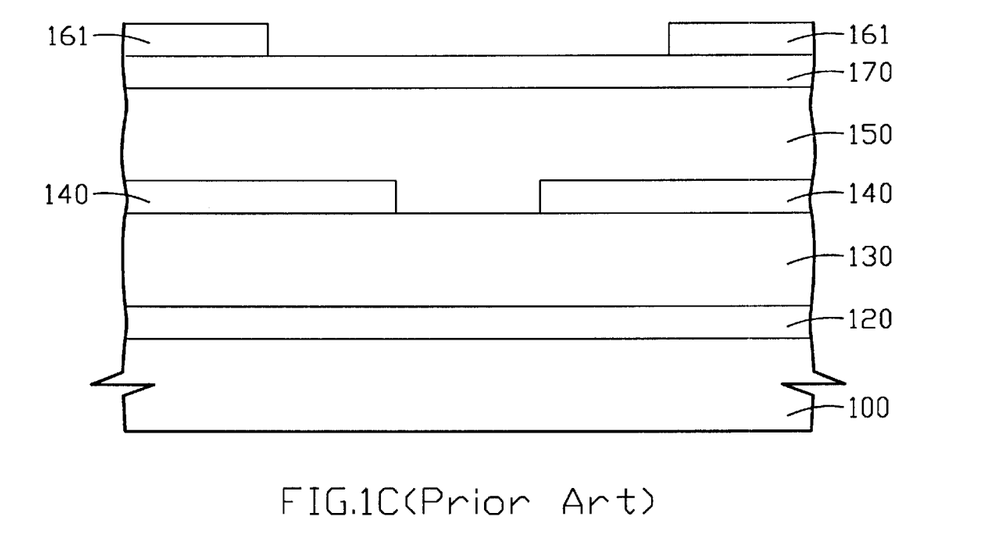

Referring to FIG. 1C, another inter-metal dielectric 150, another stop layer 170 and another photoresist 161 having the trench pattern are all formed on the surface of stop layer 140 and on the via opening of inter-metal dielectric 130. The stop layer 140 is used as a mask for the etching process due to the self-alignment via etching for forming the via. Also, the etching selectivity will be higher. If the height of the stop layer 140 is not enough or the etching condition is changed, then the via could be corner faceted. Even the via pattern will be lost.

Figure 1D:
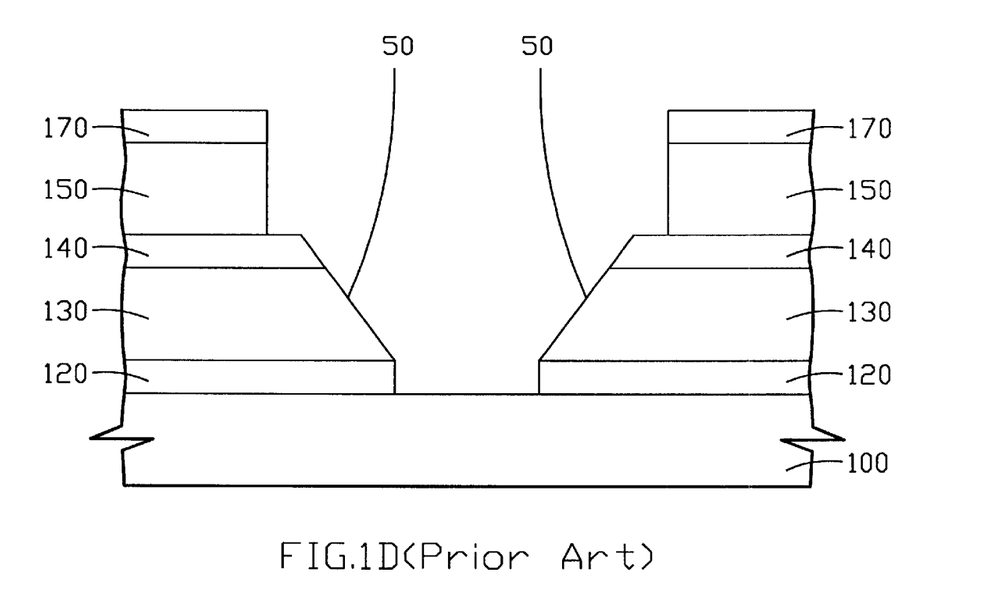

Then, as shown in FIG. 1D, the pattern from the photoresist 161 is transferred by the anisotropy etching. The stop layer 170, inter-metal dielectric 150, through the stop layer 140 and the inter-metal dielectric 130 are all etched and stop at the substrate 100. Then, the photoresist layer 161 is removed. Here, shown as LEGEND 50, there is an obvious corner faceted established on the via shoulder.

Figure 1E:
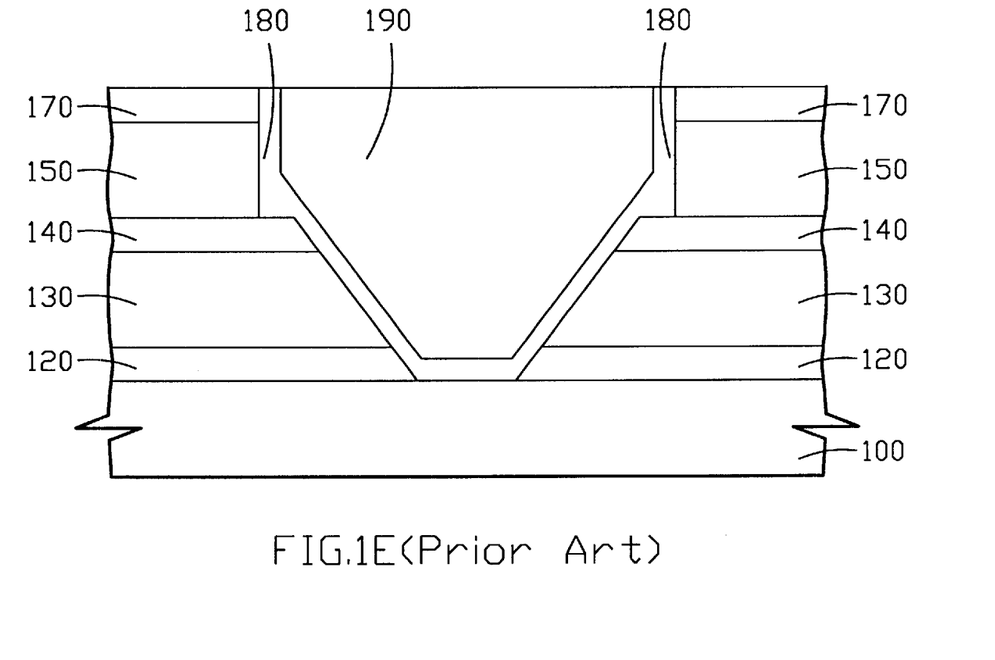

As shown in FIG. 1E, a barrier layer 180 is deposited and a metal layer 190, such as tungsten, aluminum or copper, is subsequently deposited to fill the via hole and trench line. Finally, the dual damascene structure is completed using chemical mechanical polishing to remove excess metal layer.

For 0.18 $\mu$m process and beyond, the dual damascene process is a key technology to push the design rule tightly, but it is difficult to control the process window especially in via and metal trench formation. Thus, good resolution of lithography (a misalignment issue) and high selectivity of via etching is the key issue for back end interconnection.

Therefore, within the microelectronics industry, there is an ongoing trend toward miniaturization coupled with higher performance. The scaling of transistors toward smaller dimensions, higher speeds, and low power has resulted in an urgent need for low constant inter-level insulators. Low dielectric constant inter-level dielectrics have already been identified as being critical to the realization of high performance integrated circuits. Thus, there exists a need in the microelectronics industry for a thermally stable, non-corrosive low dielectric constant polymer with good solvent resistance, high glass transition temperature, good mechanical performance and good adhesive properties, particularly to copper.

SUMMARY OF THE INVENTION

In accordance with the present invention, a method is provided for forming the dual damascene structure that substantially obtains better shape without getting corner faceted.

It is object to fill up a removable dielectric layer into the via profile in order to increase the etching selectivity of the stop layer and the etching selectivity of the dielectric in the via. Thus, the profile can be maintained even if it is under the trench pattern etching.

In one preferred embodiment, a semiconductor substrate is provided, the substrate has a first silicon nitride layer formed thereon, and a first inter-metal layer is formed on the surface of the first stop layer.

A first photoresist layer is formed on the first inter-metal layer, and the first photoresist layer has a metal via pattern formed on. The first inter-metal layer is etched to form an opening in the inter-metal layer using the first photoresist as an etching mask. A second silicon nitride layer is formed on the surface of the first inter-metal layer. A dielectric layer is formed to fill up an opening and the second silicon nitride layer. This above dielectric layer is more removable than the first and the second dielectric layer. Also, the etching selectivity of this dielectric layer to the first, the second and the third silicon nitride layer is higher than the first and second dielectric layer. Then, the dielectric layer is etched back until the second silicon nitride is exposed.

A second inter-metal layer is formed on the surface of the second silicon nitride layer and the dielectric layer. A second photoresist layer is formed on the surface of the second dielectric layer. The second photoresist has a trench opening pattern. The second inter-metal layer is etched using the second photoresist as an etching mask. The third silicon nitride layer is formed on the surface of the second inter-metal layer, the second silicon nitride layer and the dielectric layer. The third silicon nitride layer is etched back until the dielectric layer is exposed. The dielectric layer is removed from the opening. The third silicon nitride layer, the second silicon nitride layer and the first stop layer are etched until the substrate, the first dielectric layer and the second dielectric layer are exposed. The barrier layer is deposited into a via trench which is formed into the first inter-metal layer and the second inter-metal layer. The trenches are filled by a metal layer. Finally, the metal layer is planarized to expose the surface of the second dielectric layer in order to form a metal via structure.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed.

Moreover, while the present invention is illustrated by one preferred embodiment directed to the dual damascene, it is not intended that these illustrations be a limitation on the scope or applicability of the present invention. Thus, it is not intended that the semiconductor devices of the present invention be limited to the structures illustrated. These devices are included to demonstrate the utility and application of the present invention to presently preferred embodiments.

Figure 2A:
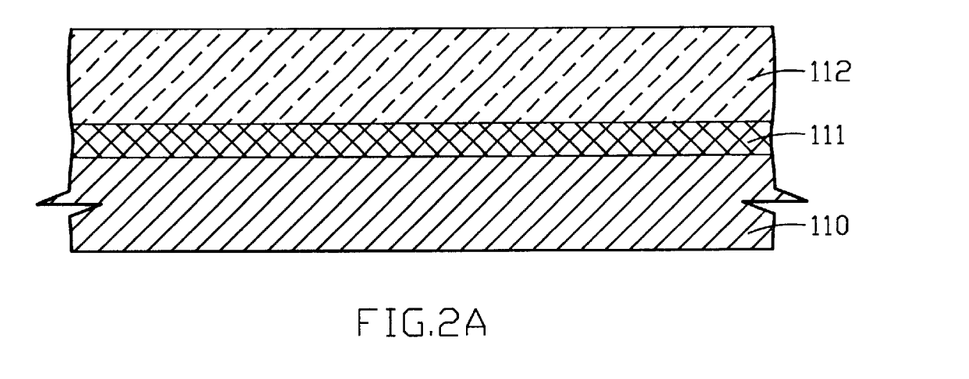
FIGS. 2A through 2N are schematic diagrams showing the structure of the embodiment of present invention.
Figure 2B:
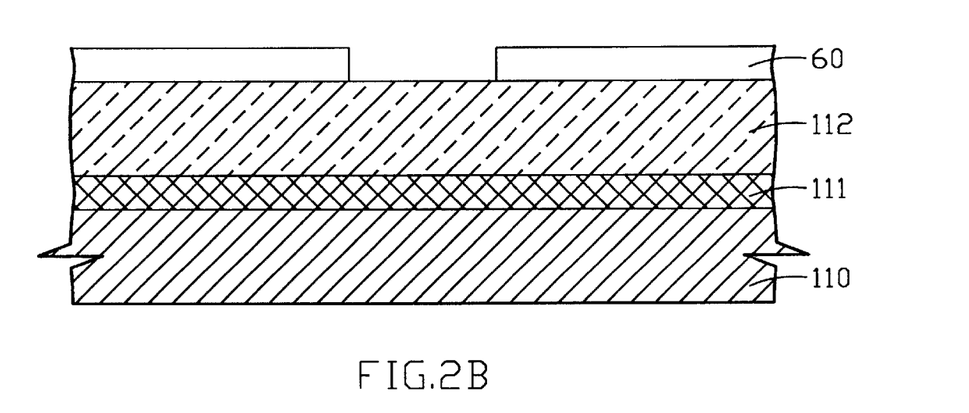
Figure 2C:
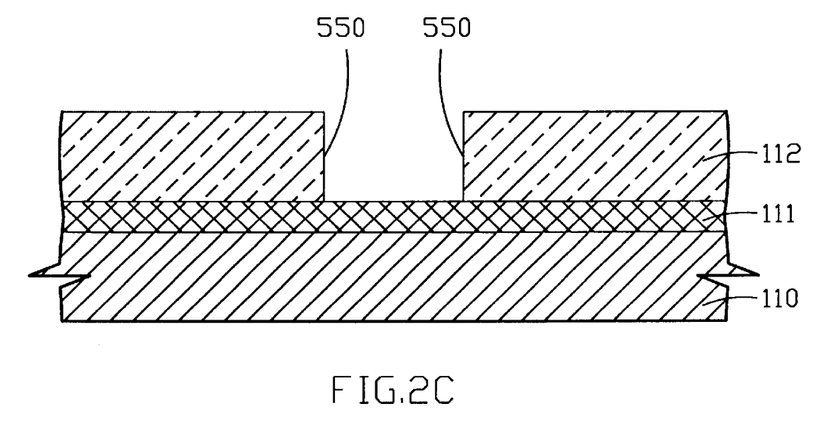
Figure 2D:
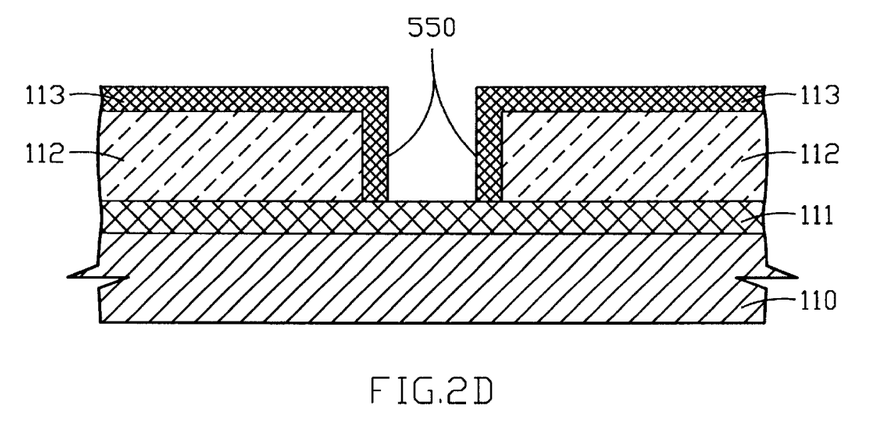
Figure 2E:
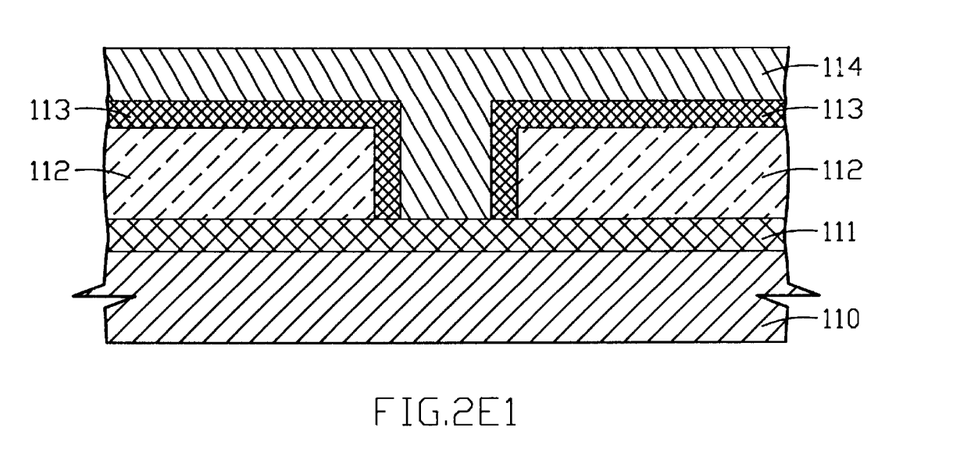
Figure 2E:
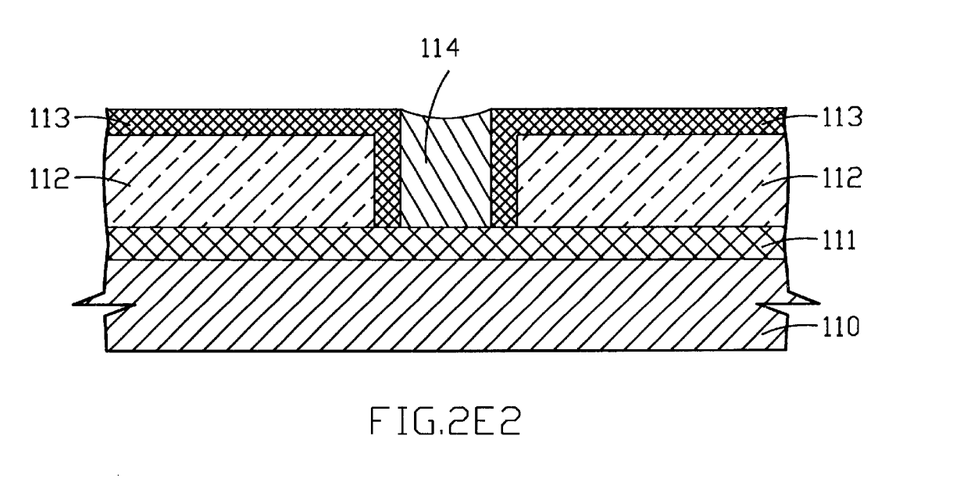
Figure 2F:
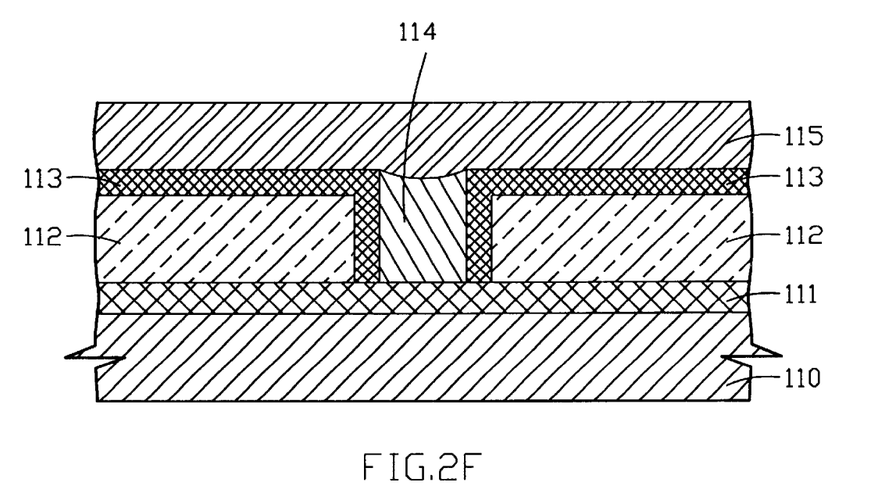
Figure 2G:
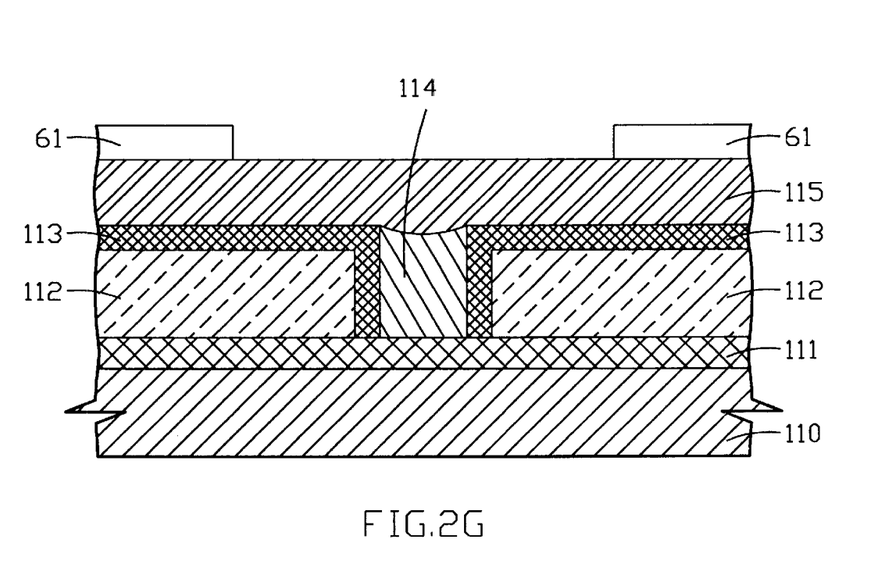
Figure 2H:
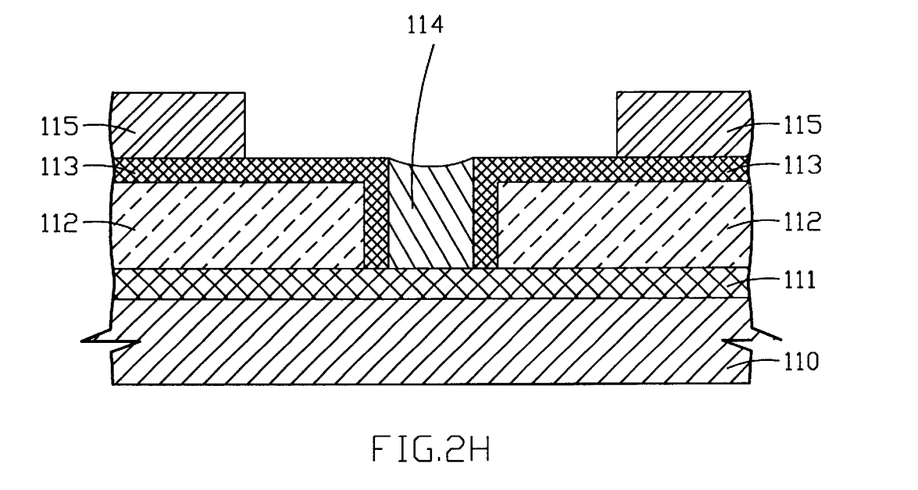
Figure 2I:
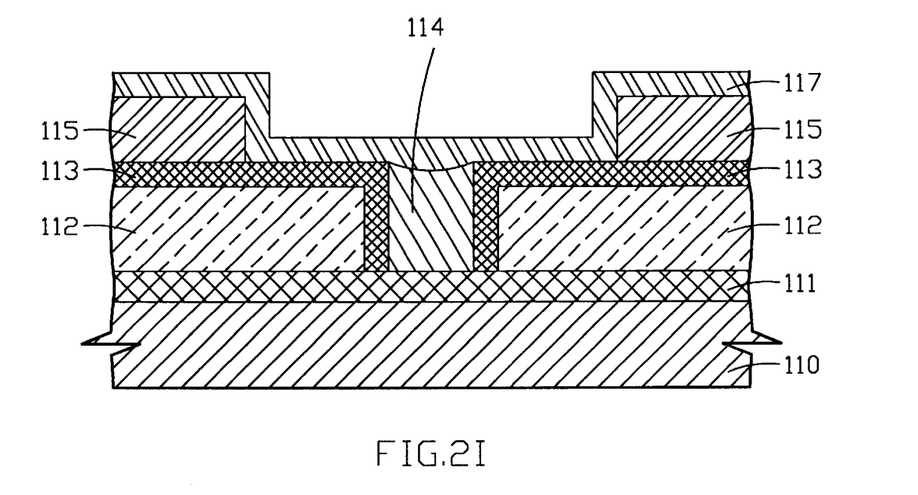
Figure 2J:
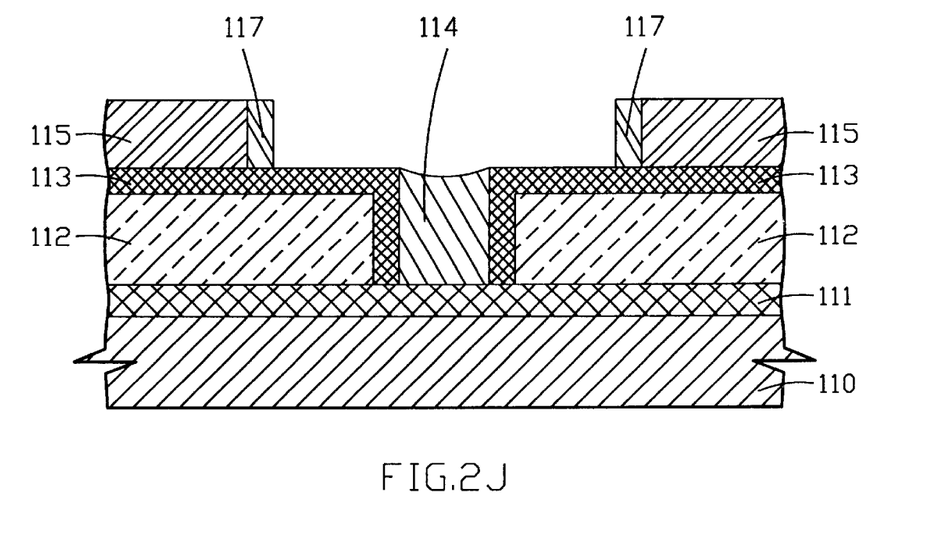
Figure 2K:
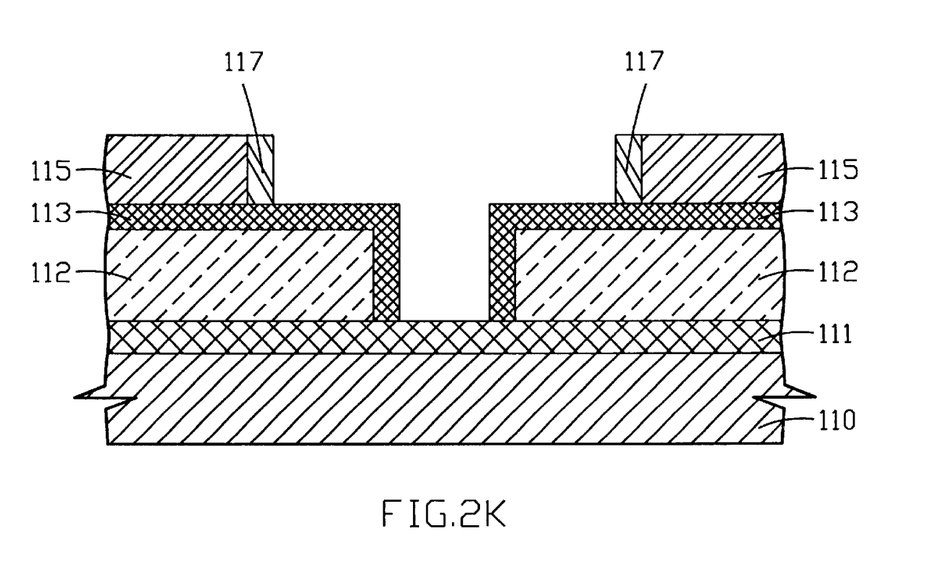
Figure 2L:
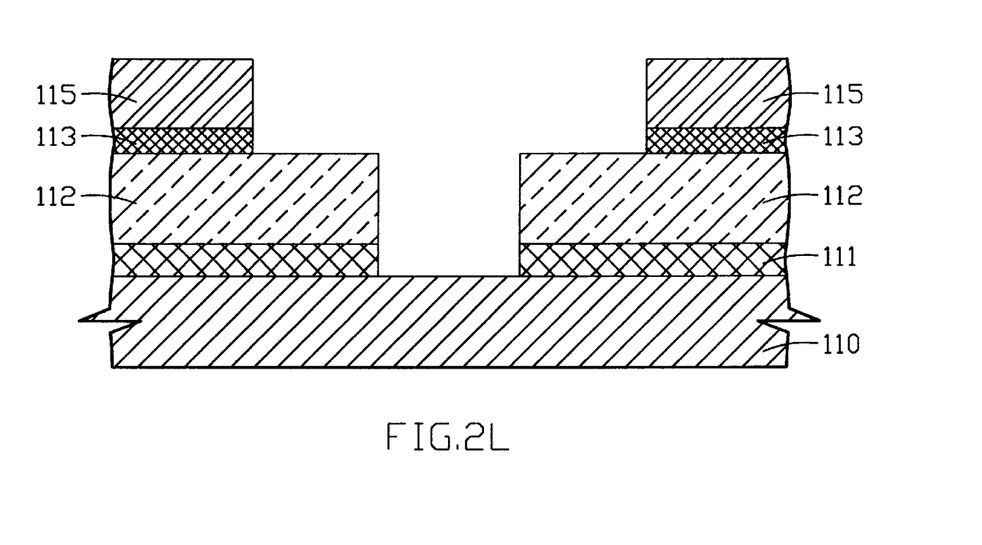
Figure 2M:
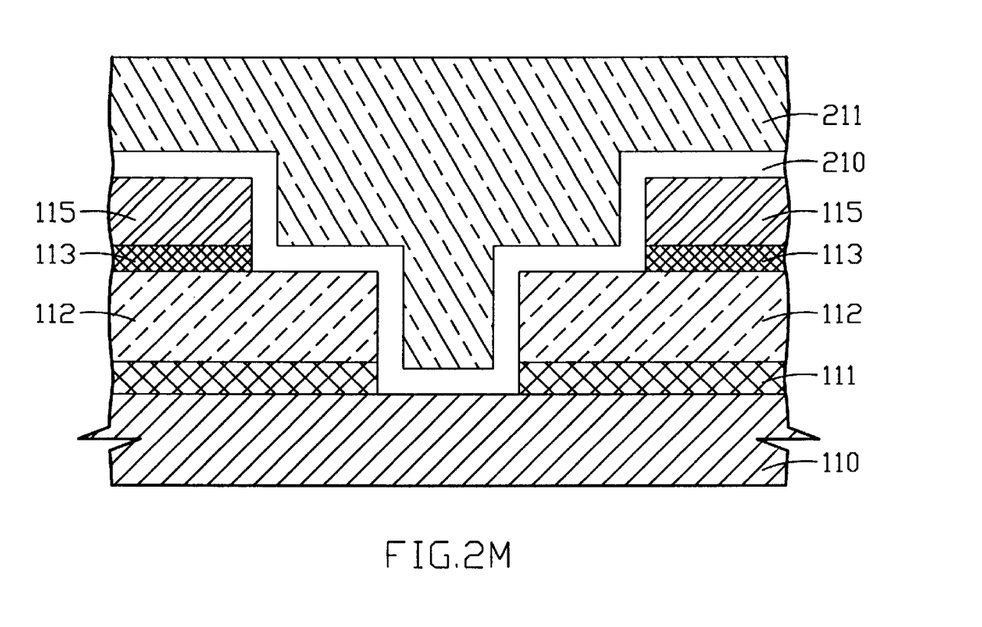
Figure 2N:
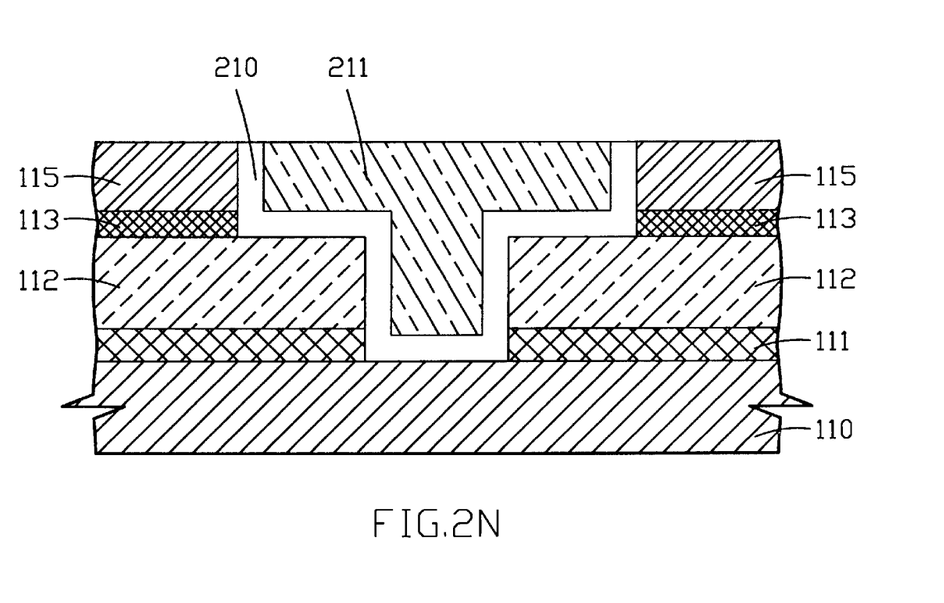

The spirit of the proposed invention can be explained and understood by the following embodiments with corresponding FIGS. 2A to 2N. Thus, a preferred embodiment for forming a metal via structure without corner faceted is described as the follows.

As shown in FIG. 2A, a semiconductor substrate 110 is provided, the semiconductor substrate 110 has a first silicon nitride layer 111 or SiC layer 111 as the first stop layer 111 formed thereon, a first inter-metal layer 112 is formed on the surface of the first stop layer 111. The thickness of this first silicon nitride layer is about 400~600 angstroms, the formation temperature for the silicon nitride layer is about 400° C. to 800° C., the formation temperature for silicon nitride layer is about few torrs to 100 mtorrs.

As shown in FIG. 2B, a first photoresist layer 60 is formed on the first inter-metal layer 112, the first photoresist layer 60 has a metal via pattern formed on. The thickness of this is about 5000 to 15000 angstroms.

As shown in FIG. 2C, by the conventional dry plasma etching, the first inter-metal layer 112 is etched to form an opening 550 in the inter-metal layer 112 using the first photoresist 60 as an etching mask. Also, the etching process is stopped at the first stop layer 111.

As shown in FIG. 2D, a second silicon nitride layer 113 as a second stop layer is formed on the surface of the first inter-metal layer 112. The thickness of this second silicon nitride layer is about 400~600 angstroms, the formation temperature for the silicon nitride layer is about 400° C. to 800° C., the formation temperature for silicon nitride layer is about few torrs to 100 mtorrs.

As shown in FIG. 2E-1, a dielectric layer 114 is formed to fill up an opening 550 by using spin-on-glass-(SOG). The dielectric constant of this dielectric layer is about 2.6 to 2.8 and the thickness of this dielectric layer 114 is about 4000 angstroms to 5000 angstroms. Then, as shown in FIG. 2E-2 the dielectric 114 is removed by using blanket etch back.

As shown in FIG. 2F, by the chemical vapor deposition, a second inter-metal layer 115 is formed on the surface of the second silicon it nitride layer 115 and the dielectric layer 114.

As shown in FIG. 2G, a second photoresist layer 61 is formed on the surface of the second inter-metal layer 115. The second photoresist 61 has a trench opening pattern and the thickness of this photoresist 61 is about 5000 to 15000 angstroms.

As shown in FIG. 2H, by the conventional plasma etching, the second inter-metal layer 115 is etched using the second photoresist 61 as an etching mask. The etching process is stopped at the second stop layer 113.

As shown in FIG. 2I, the third silicon nitride layer 117 is formed on the surface of the second inter-metal layer 115, the second silicon nitride layer 113 and the dielectric layer 114. The thickness of this fourth silicon nitride layer 117 is about 400~600 angstroms, the formation temperature for the silicon nitride layer is about 400° C. to 800° C., the formation temperature for the silicon nitride layer is about few torrs to 100 mtorrs.

As shown in FIG. 2J, the fourth layer 117 is etched back until the dielectric layer 114 is exposed.

As shown in FIG. 2K, by the wet etching such as BOE and diluted HF, the dielectric layer 114 is removed on the opening. Here, the wet etching can remove the dielectric 114 in the via but the wet etching can not be employed for the prior art.

As shown in FIG. 2L, the third stop layer (third silicon nitride layer) 117, the second silicon nitride layer 113 and the first stop layer 113 are etched until the second dielectric layer 115, the first dielectric 112 and the substrate 110 are all exposed.

As shown in FIG. 2M, the barrier layer 210 such as silicon tantalum or TiN layer is deposited by then sputter or the CVD into a via trench which is formed into the first inter-metal layer 112 and the second inter-metal layer 115. The thickness of this silicon tantalum is about 200 to 500 angstroms. The via trenches in the first inter-metal layer 112 and the second inter-metal layer 115 are all filled using the PVD by the metal layer 211 which is copper alloy, aluminium alloy or aluminium-copper alloy.

Finally, as shown in FIG. 2N, the metal layer 211 is planarized by chemical mechanical polishing to expose the surface of the second dielectric layer 115. Thus a metal via structure is formed by the above processes.

Also, in accordance with the present invention, a method is provided for forming inter-metal dielectric layer using dual damascene structure that substantially obtains larger lithography process window without etching the stop layer, i.e., PR lithography can be well controlled. It is therefore an objection of the low height of SOG Oxide.

There is another object of this invention that etching the silicon nitride stop layer is not used. Therefore, the thickness of the photoresist layer is reduced to increase D.O.F., then the better process can be obtained.

In the previous preferred embodiment, it is briefly described as the following: a semiconductor substrate is provided, the substrate owns a first silicon nitride layer formed thereon, a first inter-metal layer is formed on the surface of the first stop layer.

A first photoresist layer is formed on the first inter-metal layer, the first photoresist layer has a metal via pattern formed on. The first inter-metal layer is etched to form an opening in the inter-metal layer using the first photoresist as an etching mask. A second silicon nitride layer is formed on the surface of the first inter-metal layer. A dielectric layer is formed to fill up an opening and the second silicon nitride layer. This above dielectric layer is much removable than the first and the second dielectric layer. Also, the etching selectivity of this dielectric layer to the first, the second and the third silicon nitride layer is higher than the first and second dielectric layer. Then, the dielectric layer is etched back until the second silicon nitride is exposed.

A second inter-metal layer is formed on the surface of the second silicon nitride layer and the dielectric layer. A second photoresist layer is formed on the surface of the second dielectric layer. The second photoresist owns a trench opening pattern. The second inter-metal layer is etched using the second photoresist as an etching mask. The third silicon nitride layer is formed on the surface of the second inter-metal layer, the second silicon nitride layer and the dielectric layer. The third silicon nitride layer is etched back until the dielectric layer is If exposed. The dielectric layer is removed on the opening. The third silicon nitride layer, the second silicon nitride layer and the first stop layer are etched until the substrate, the first dielectric layer and the second dielectric layer are exposed. The barrier layer is deposited into a via trench which is formed into the first inter-metal layer and the second inter-metal layer. The trenches is filled by a metal layer. Finally, the metal layer is planarized to expose surface of the second dielectric layer in order to form a metal via structure.

Although specific embodiments have been illustrated and described, it will be obvious to those skilled in the art that various modifications may be made without departing from what is intended to be limited solely by the appended claims.

What is claimed is:

1. A method for forming a metal interconnection structure without corner faceted, comprising:
   providing a semiconductor substrate having a first stop layer formed thereon, a first inter-metal layer being formed on the surface of the first stop layer;
   etching said first inter-metal layer to form an opening in said inter-metal layer using a first photoresist as an etching mask;
   forming a second stop layer on the surface of said first inter-metal layer;
   forming a dielectric layer to fill up said opening and on the surface of said second stop layer;
   etching back said dielectric layer until said second stop layer is exposed;
   forming a second inter-metal layer on the surface of said second stop layer and said dielectric layer;
   etching said second inter-metal layer using a second photoresist as an etching mask;
   forming a third stop layer on the surface of said second inter-metal layer, said second stop layer and said dielectric layer;
   etching back said third layer until said dielectric layer being exposed;
   removing said dielectric layer in said opening;
   etching said third stop layer, said second stop layer and said first stop layer until said second inter-metal layer, said first inter-metal layer and said semiconductor substrate being exposed;
   depositing a barrier layer into a via trench which is formed into said first inter-metal layer and said second inter-metal layer;
   filling the trenches with a metal layer; and
   planarizing said metal layer to expose surface of said second dielectric layer in order to form a metal via structure.

2. The method according to claim 1, wherein said first photoresist has a thickness between about 5000 to 15000 angstroms.

3. The method according to claim 1, wherein said second photoresist has a thickness between about 5000 to 15000 angstroms.

4. The method according to claim 1, wherein said first stop layer comprises silicon nitride.

5. The method according to claim 1, wherein said first stop layer comprises SiC.

6. The method according to claim 1, wherein said second dielectric layer has a thickness between about 4000 to 5000 angstroms.

7. The method according to claim 1, wherein said forming dielectric layer comprises spin-on-glass.

8. The method according to claim 1, wherein said barrier layer comprises tantalum nitride.

9. The method according to claim 1, wherein said barrier layer comprises TiN.

10. The method according to claim 1, wherein said metal comprises copper alloy.

11. The method according to claim 1, wherein said metal comprises aluminium alloy.

12. The method according to claim 1, wherein said planarizing said metal comprises chemical mechanical polishing.

13. A method for forming a metal interconnection structure without corner faceted, comprising:
   providing a semiconductor substrate having a first silicon nitride layer formed thereon, a first inter-metal layer being formed on the surface of the first stop layer;
   forming a first photoresist layer on said first inter-metal layer, said first photoresist layer having a metal via pattern formed on;
   etching said first inter-metal layer to form an opening in said inter-metal layer using said first photoresist layer as an etching mask;
   forming a second silicon nitride layer on the surface of said first inter-metal layer;
   forming a dielectric layer to fill up said opening and on the surface of said second silicon nitride layer;
   etching back said dielectric layer until said second silicon nitride layer is exposed;
   forming a second inter-metal layer on the surface of said second silicon nitride layer and said dielectric layer;
   forming a second photoresist layer on the surface of said second inter-metal layer, said second photoresist layer having a trench opening pattern;
   etching said second inter-metal layer using said second photoresist layer as an etching mask;
   forming a third silicon nitride layer on the surface of said second inter-metal layer, said second silicon nitride layer and said dielectric layer;
   etching back said third silicon nitride layer until said dielectric layer being exposed;
   removing said dielectric layer in said opening;
   etching said third silicon nitride layer, said second silicon nitride layer and said first silicon nitride layer until said second inter-metal layer, said first dielectric layer and said semiconductor substrate being exposed;
   depositing a barrier layer into a via trench which is formed into said first inter-metal layer and said second inter-metal layer;

filling the trenches with a metal layer; and planarizing said metal layer to expose surface of said second dielectric layer in order to form a metal via structure.

14. The method according to claim 13, wherein said first photoresist layer has a thickness between about 5000 to 15000 angstroms.

15. The method according to claim 13, wherein said second photoresist layer has a thickness between about 5000 to 15000 angstroms.

16. The method according to claim 13, wherein said first dielectric layer has a thickness between about 4000 to 5000 angstroms.

17. The method according to claim 13, wherein said forming dielectric layer comprises spin-on-glass.

18. The method according to claim 13, wherein said barrier layer comprises tatalum nitride.

19. The method according to claim 13, wherein said barrier layer comprises tantalum.

20. The method according to claim 13, wherein said barrier layer comprises TiN.

21. The method according to claim 13, wherein said metal layer comprises copper alloy.

22. The method according to claim 13, wherein said metal layer comprises aluminium alloy.

23. The method according to claim 13, wherein said planarizing said metal comprises chemical mechanical polishing.

* * * * *